(12) United States Patent
Temming et al.

(10) Patent No.: US 10,938,391 B2
(45) Date of Patent: Mar. 2, 2021

(54) DEVICE HAVING A TOUCH-SENSITIVE FREE-FORM SURFACE AND METHOD FOR THE PRODUCTION THEREOF

(71) Applicant: VOLKSWAGEN AKTIENGESELLSCHAFT, Wolfsburg (DE)

(72) Inventors: Carsten Temming, Braunschweig (DE); Johannes Rhede, Berlin (DE)

(73) Assignee: Volkswagen Aktiengesellschaft

( * ) Notice: Subject to any disclaimer, the term of this patent is extended or adjusted under 35 U.S.C. 154(b) by 0 days.

(21) Appl. No.: 16/349,655

(22) PCT Filed: Jun. 16, 2017

(86) PCT No.: PCT/EP2017/064790
§ 371 (c)(1),
(2) Date: May 14, 2019

(87) PCT Pub. No.: WO2018/091152
PCT Pub. Date: May 24, 2018

(65) Prior Publication Data
US 2019/0369770 A1    Dec. 5, 2019

(30) Foreign Application Priority Data

Nov. 15, 2016 (DE) .................... 10 2016 222 419.0
Jan. 16, 2017 (DE) .................... 10 2017 200 595.5

(51) Int. Cl.
*H03K 17/96* (2006.01)
*G06F 3/044* (2006.01)

(52) U.S. Cl.
CPC ......... *H03K 17/962* (2013.01); *G06F 3/0446* (2019.05); *G06F 2203/04103* (2013.01); *H03K 2217/96062* (2013.01)

(58) Field of Classification Search
None
See application file for complete search history.

(56) References Cited

U.S. PATENT DOCUMENTS

| 9,256,325 B2 | 2/2016 | Lee |
| 9,298,220 B2 | 3/2016 | Choi et al. |
| (Continued) | | |

FOREIGN PATENT DOCUMENTS

| CN | 203799363 U | 8/2014 |
| EP | 2130113 A1 | 12/2009 |
| (Continued) | | |

OTHER PUBLICATIONS

Search Report for International Patent Application No. PCT/EP2017/064790; dated Oct. 2, 2017.
(Continued)

*Primary Examiner* — Ifedayo B Iluyomade
(74) *Attorney, Agent, or Firm* — Barnes & Thornburg LLP (57) ABSTRACT

A device including a touch-sensitive free-form surface, the free-form surface having an outer surface and a position detection unit having a sensor surface. The sensor surface and the free-form surface have different geometric shapes, and switching elements are arranged between the sensor surface and the free-form surface, each having a first end and an opposing second end. The first ends are assigned to different detection positions on the free-form surface, and the second ends are assigned to different sensor positions on the sensor surface of the position detection unit so that touches of the free-form surface are transmitted to the sensor surface via the switching elements and are spatially detected by the position detection unit. Also disclosed is a method for producing such a device.

13 Claims, 8 Drawing Sheets

(56) References Cited

U.S. PATENT DOCUMENTS

| | | |
|---|---|---|
| 9,804,701 B2 | 10/2017 | Westerman et al. |
| 2010/0103138 A1 | 4/2010 | Huang et al. |
| 2010/0302200 A1* | 12/2010 | Netherton ............. G06F 3/0202 |
| | | 345/174 |
| 2016/0162093 A1* | 6/2016 | Kim ...................... G06F 3/0412 |
| | | 345/174 |
| 2016/0170498 A1 | 6/2016 | Parker |
| 2016/0246375 A1 | 8/2016 | Rihn et al. |
| 2017/0344145 A1* | 11/2017 | Lo ......................... G06F 3/0412 |

FOREIGN PATENT DOCUMENTS

| | | |
|---|---|---|
| EP | 2256602 A2 | 12/2010 |
| EP | 2495640 A1 | 9/2012 |
| EP | 2876196 A1 | 5/2015 |
| EP | 2899623 A2 | 7/2015 |
| KR | 100595917 B1 | 7/2006 |
| WO | 2010147692 A1 | 12/2010 |

OTHER PUBLICATIONS

Written Opinion for Korean Patent Application No. 10-2019-7016868; dated Oct. 13, 2020.

* cited by examiner

DEVICE HAVING A TOUCH-SENSITIVE FREE-FORM SURFACE AND METHOD FOR THE PRODUCTION THEREOF

PRIORITY CLAIM

This patent application is a U.S. National Phase of International Patent Application No. PCT/EP2017/064790, filed 16 Jun. 2017, which claims priority to German Patent Application Nos. 10 2016 222 419.0, filed 15 Nov. 2016, and 10 2017 200 595.5, filed 16 Jan. 2017, the disclosures of which are incorporated herein by reference in their entireties.

SUMMARY

Illustrative embodiments relate to a device for detecting user inputs via tactile actuation. Illustrative embodiments further relate to a method for the manufacture of such a device.

BRIEF DESCRIPTION OF THE DRAWINGS

The disclosed embodiments are explained in more detail below with reference to the drawings, in which.

DETAILED DESCRIPTION

Operating units comprising touch-sensitive surfaces are known from the prior art. With the aid of these operating units, user inputs can be detected on the basis of the touch position on a surface. Known sensors are so-called touchpads or touchscreens. These have a sensor surface, and can detect a touch position on the sensor surface. This detected position is then made available as a signal and can be processed further. If such a touch-sensitive sensor surface is transparent in design and arranged in front of a freely programmable display surface, then such a combination of a touch-sensitive, transparent surface and a display surface arranged behind it is referred to as a touchscreen. If the sensor apparatus is capable of detecting multiple touch positions simultaneously, then such a sensor apparatus is referred to as multi-touch capable.

In mobile telephones referred to as smartphones, but also in operating terminals of cash dispensers etc., touchscreens and touchpads are used as sensors for the detection of user inputs. Multi-touch capable systems which are usually based on so-called "mutual capacitance" systems that evaluate a capacitance change between electrodes that may be configured as rows and columns and insulated from one another and are usually formed on a rear side of a touch surface or sensor surface, are common. In such a construction in which the electrodes are formed on the side that faces away from the touch, a touchscreen is called a projected capacitive touchscreen. The technology is referred to as PCT technology, wherein PCT is an acronym for the English expression "projected capacitive touch".

It is necessary to detect user inputs at many points in the field of technology. The more complex objects and devices become, the greater is the need to detect a large number of user inputs. One field in which this development can be seen is that of transportation vehicles. Whereas in the past transportation vehicles only comprised a small number of operating elements as, for example, switches, to be able to operate a small number of transportation vehicle functions, a large number of assistance systems as well as entertainment systems and multimedia systems, through which functions and services that are internal and external to the transportation vehicle can be operated, are nowadays integrated into transportation vehicles. A large number of transportation vehicles nowadays, for example, comprise operating elements that are integrated into a steering wheel or a steering wheel surface. To increase the input facilities, in particular, to make the input facilities flexible, and to enable the most intuitive possible operation of transportation vehicle functions and/or systems as well as systems external to the transportation vehicle or coupled to transportation vehicles, it is also desirable to integrate touch-sensitive sensors at positions in the transportation vehicle that have a highly curved surface. An integration of touch-sensitive sensors at these positions has not yet been satisfactorily achieved.

A data input device is known from US 2016/0170498 A1 that comprises a housing with a front side and a rear side and handle segments that are laterally separated from one another. The user can hold the housing at the handle segments and simultaneously actuate operating elements that are partially formed on the front side and partially on the rear side, with his fingers. Some of these buttons formed on the front side and rear side can be implemented as touch-sensitive buttons. It is further described that touch-sensitive surfaces can be integrated into the housing. The device may further be designed in such a way as to accept a mobile telephone or a tablet at the front side in the center between the handle segments.

A device with a curved display surface is known from U.S. Pat. No. 9,256,325 B2 onto which an image can be projected from behind. An infrared camera is further arranged on the rear side which can recognize touches of the curved surface and can determine their touch position. The information projected from behind onto the display surface can be changed depending on the captured touch positions.

An electrical control device for a transportation vehicle is known from EP 2 130 113 B1 which control device comprises a sensor with a touch surface that uses resistances that are pressure-sensitive and are connected to a carrier that comprises a three-dimensional recessed or projecting surface, wherein the touch surface of the sensor has a shape that is so designed that in the assembled state at least a portion of the structured touch surfaces meet each other in that they adapt to the shape of the three-dimensional surface to constitute a touch surface that is essentially continuous, wherein the structured touch surface comprises a predetermined number of arc-shaped strips whose small, convex sides are connected to a common substrate and have the shape of a disc, so that the touch surface adapts to a carrier that has a recessed surface with the shape of a truncated cone. Another disclosed embodiment provides that the structured touch surface comprises a predetermined number of arc-shaped strips whose large, convex sides are connected to a common substrate and have a parallelepipedal shape, so that the touch surface adapts to a carrier that has a recessed surface with the shape of a truncated cone.

The known embodiments have the drawback that as a rule only regularly shaped surfaces, for example, curved in one direction, can be provided with spatially resolved touch-sensitive sensor foils.

The disclosed embodiments create a device for a touch-sensitive, spatially resolved user input facility that comprises a free-form surface.

The disclosed embodiments provide a device and a method.

The disclosed embodiments are based on the idea of using known touch-sensitive sensors that are usually of flat design for detecting the user input, and arranging these at a distance from a free-form surface. To be able to sense the touching at the free-form surface, a plurality of relaying elements, each of which comprises two opposing ends, are arranged between the free-form surface and the sensor surface of the position detection unit. One end is arranged at or in the free-form surface and the opposing end at the sensor surface of the position detection unit. This makes it possible to transfer, so to speak, touches at the free-form surface through the relaying elements to the sensor surface. Through this it becomes possible to combine position detection units that are economical and manufactured in large numbers and are designed for a touch-sensitive detection, in a spatially resolved manner, with arbitrary free-form surfaces and to create economical devices for a touch detection in a spatially resolved manner at a free-form surface.

It is provided to create a device with a touch-sensitive free-form surface which device comprises a free-form surface as an outer surface and a position detection unit with a sensor surface, wherein the sensor surface and the free-form surface have different geometrical shapes, and a plurality of relaying elements are arranged between the sensor surface and the free-form surface, each of which comprises a first end and an opposing second end, wherein the first ends are assigned to different detection positions on the free-form surface and the second ends are assigned to different sensor positions on the sensor surface of the position detection unit, so that touches of the free-form surface can be conveyed through the relaying elements to the sensor surface and can be detected in a spatially resolved manner by the position detection unit. Locations on the free-form surface are thus assigned to the locations on the sensor surface, so that the position on the free-form surface can be uniquely determined on the basis of the "touch position" determined on the sensor surface. In this way it becomes possible for surfaces of almost any shape, for example, of operating modules in a transportation-vehicle steering wheel, to be designed with a so-called touch capability.

A special benefit consists in that surface structures with small radii of curvature, and even surfaces with corners and edges, can also be designed for a detection of touch in a spatially resolved manner. This is an enormous improvement over the prior art in which, for example, touch-sensitive spatially-resolving sensor foils have to be matched and molded to the free-form surface.

Optionally, the sensor surface is designed flat, so that position detection units that are manufactured in large numbers and are economical can be used.

Even when a sensor surface of the position detection unit has a flat implementation, the free-form surface can be of arbitrary shape and nevertheless designed for a touch detection in a spatially resolved manner. Even surface segments that are oriented perpendicularly to the sensor surface or undercut surface segments of the free-form surface can be or be designed to be touch-sensitive.

In some disclosed embodiments, the free-form surface is of three-dimensional design. This means that, with reference to a Cartesian coordinate system, there is no flat surface in which all the detection positions of the surface of the free-form surface are located. Surface shapes that have a suitable feel can thus be chosen, which, for example, enable a tactile orientation without being looked at, i.e., for example, also without looking away from traffic.

Optionally, one or more operating regions, formed as recesses or projections, are formed on the free-form surface. Optionally, the free-form surface thus comprises depressions that are formed as recesses and/or projections. This has the benefit that a tactile and visual orientation of a user is possible in a simple manner.

To convey the touching at the free-form surface to the sensor surface of the position detection unit, the relaying elements may be electrically conductive. This allows the use of a large number of position detection units that evaluate electrical properties at or above the sensor surface.

In at least one disclosed embodiment, the relaying elements are arranged in a regular grid. To create them, metal rods can, for example, be arranged in a regular grid and held in an insulating molded body.

The free-form surface can, for example, be created by a chip-removal method in which both the molded body and the metal rods held therein are themselves machined to create the free-form surface or its contour. This method makes it possible to create individual free-form surfaces in a simple manner on the basis of blanks, i.e. of molded bodies within which relaying elements are formed or held.

In some disclosed embodiments, the relaying elements are insulated from one another by air at least in some sections. For example, metal rods that are held or retained in a body of insulating material can engage in hollow channels of a molded body without touching the channel walls, or be arranged at a circumferential distance from the channel walls at least over segments of the channel.

To create an attractive surface and to protect it against external stresses, it is provided in at least one disclosed embodiment that the free-form surface comprises a protective layer formed from an insulating material. This can, for example, consist of a thin layer of leather or a smooth or roughened plastic layer. Other disclosed embodiments provide a paint layer, consisting, for example, of a synthetic resin material. The protective layer can also be formed by a wood veneer.

A further benefit of an insulating protective layer consists in that the device is protected against electrostatic discharges (ESD).

In another disclosed embodiment, the relaying elements are formed, at least in sections, as conductive channels in an insulating molded body of which at least one surface follows or determines a contour of the free-form surface. Such a molded body can, for example, be manufactured in an injection molding or injection stamping method. Channels that are not connected to one another can be formed here in the interior and filled with a conductive material. The filling of the channels with the conductive material, for example, with a plastic material to which metal or plastic particles have been added, can also take place in an injection molding or injection stamping method.

The molded body can, however, also be formed by a chip-removal method and be provided with channels through drilled holes which are then, for example, filled with a plastic material, a synthetic resin, for example, provided with conductive particles. What is important is that the individual, formed channels are electrically insulated from one another.

Molded bodies with relaying elements, such as conductive channels, insulated from one another, can also be manufactured as blanks with a basic form. The free-form surface can then be formed subsequently with a chip-removal method or a method of another nature.

Another possible way of forming a physical structure that determines the contour of the free-form surface and at the same time comprises the relaying elements or parts thereof, consists in forming conductive channels in an initially insulating molded body through the focused, local exposure to an electric and/or magnetic field. An electric field can, for example, be formed locally through an application of a voltage between two electrodes that are arranged at mutually opposing surfaces of the molded body or which engage with them. It can be beneficial to additionally introduce thermal energy to encourage the formation of conductive, mutually insulated channels. In such a process, for example, particles that are initially homogeneously dispersed can be locally rearranged so that relaying elements for a capacitive coupling results.

The disclosure, however, also offers the possibility of giving relatively large areas of the free-form surface the spatially resolving, touch-sensitive property, even though only a position detection unit that is designed with a significantly smaller sensor surface is used. This is made possible in that the detection positions to which first ends of the relaying elements are assigned have a lower surface density than the sensor positions to which the corresponding second ends of the relaying elements are assigned. It is, however, also equally possible to create a surface density of detection positions in specific regions of the free-form surface, to which first ends of different relaying elements are assigned, that is higher than the corresponding surface density of sensor positions of the corresponding second ends of the relaying elements.

The relaying elements do not, furthermore, have to be formed as straight metal rods or straight channels. The connecting elements can, for example, be implemented in some sections as insulated wires. It is thus possible to mount the free-form surface movably with respect to the position detection unit at the surface of which, or next to the surface of which, the second ends of the relaying elements are arranged. Thus, for example, a further molded body can be formed in which the second ends of the relaying elements are held and terminate at a sensor contact surface. This may be made flat, so that it can be easily arranged with respect to a sensor surface that is also made to be flat.

In addition, surfaces that are closed, for example, cylindrical or surrounding a steering column or steering column lever can also be given a touch-sensitivity.

A method for manufacturing a device with a touch-sensitive free-form surface may comprise a provision or formation of a position detection unit with a sensor surface, the formation of a physical structure with a free-form surface with a different geometrical shape to that of the sensor surface, and the integration of a plurality of mutually separate relaying elements into the physical structure, wherein the relaying elements each comprise a first end and an opposing second end, and wherein the first ends are assigned to different detection positions on the free-form surface and the second ends terminate at different positions of a sensor contact surface, and the physical structure and the position detection unit are arranged with respect to one another in such a way that the sensor surface and the sensor contact surface are adjacent one another, so that touches to the free-form surface are conveyed through the relaying elements to the sensor surface and can be detected in a spatially resolved manner by the position detection unit.

At least one disclosed embodiment provides that the integration of the connecting elements into the physical structure comprises a formation of a molded body in which channels that are separated from one another are formed into which the relaying elements are introduced.

It is provided in at least one disclosed embodiment that the molded body is manufactured by an injection molding or injection stamping method. Economical molded bodies with a stable shape can be manufactured in this way.

In one development it is possible for the relaying elements also to be integrated into the molded body by a conductive plastic, likewise in a molding and/or injection stamping method operation.

The relaying elements, in particular, if these are implemented as metal rods or pins, can thus be cast in a molded body. This can subsequently be machined to define the contour of the free-form surface.

Other disclosed embodiments provide that the relaying elements are formed by a conductive plastic.

In some disclosed embodiments a physical structure that contains the free-form surface as well as the connecting elements may comprise one or a plurality of molded bodies which hold the relaying elements. In some disclosed embodiments a molded body is so designed that it holds the first ends of the relaying elements and at the same time follows the contour, or specifies the contour, of the free-from surface that is provided with a spatially resolving, touch-sensitive property.

In some disclosed embodiments it is provided that the physical structure comprises a further molded body in which the second ends of the relaying elements are held. The further molded body thus comprises a sensor contact surface that is arranged in front of the sensor surface of the position detection unit. If the physical structure comprises two molded bodies, or two molded body parts separated from one another, then a part or segment of one of the connecting elements can be formed by an insulated segment of wire or cable. This makes it possible to mount the free-form surface in the physical structure movably with respect to the sensor contact surface. First end segments are held in the first molded body and second end segments in the further molded body. The first end segments are then connected together with the second end segments via segments of cable or wire.

The first end segments can also be formed as flat touch segments, and the second end segments as a sensor segment of the respective relaying element. The touch segment and the sensor segment may each be formed as an electrical contact.

In some disclosed embodiments, at least the second ends of the relaying elements are conductively connected to electrodes or electrode elements of the position detection unit.

Other disclosed embodiments however provide that there is no electrically conductive connection between the electrodes of the position detection unit and the relaying elements, but rather that only a capacitive coupling takes place. This offers a better protection against electrostatic discharges (ESD). The coupling between the relaying elements and the sensor surface of the position detection unit is, furthermore, significantly simplified. An arrangement of a molded body with the relaying elements or of a physical structure with the relaying elements relative to the sensor surface of the position detection unit is thus easier. Smaller deviations in the positioning from a target positioning can be tolerated, and potentially corrected through a calibration. The assignment of sensor positions on the sensor surface to touch positions on the free-form surface is thus adjusted. This can be done without mechanical readjustment.

A good protection against damage resulting from electrostatic discharges (ESD) is achieved if the relaying elements are electrically insulated from the outer surface of the free-form surface as well as from the electrodes of the position detection unit. The insulation at the surface of the free-form surface is, for example, achieved through the previously mentioned protective layer of an insulating paint, a thin wood veneer, a thin plastic layer etc. The insulation at the position detection unit can be realized by way of a protective foil or a glass pane, as these are present in many position detection units, or also by way of an air gap or another electrically insulating layer respectively arranged between the two ends of the relaying elements and the electrodes of the position detection unit.

In the majority of disclosed embodiments it is thus, in principle, neither necessary that an electrically conductive contact is established between an actuation element of a user, for example, a finger and a relaying element in the detection of touch at the free-form surface, nor is it necessary that an electrically conductive contact is established between the actuation element and an electrode of the position detection unit during the touch. The detection of position in a spatially resolved manner at the surface of the free-form surface then takes place through a capacitive coupling of the actuation element at the position detection unit through the relaying elements.

Embodiments are also possible in which the relaying elements are not constructed to be continuously conductive but rather, for example, only in segments, wherein the ends and beginnings of the segments are arranged adjacently in such a way that a capacitive coupling results along the full extent of a relaying element when touched.

A physical structure, and, in particular, a molded body, can also be manufactured in an additive manufacturing method, for example, in a 3D printing method. Electrically insulating and electrically conductive materials may be processed together to specify the free-form surface contour and at the same time to form the relaying elements, coupled thereto, that connect the free-form surface to the sensor contact surface.

The position detection unit may be constructed on a circuit board. This may comprise the evaluation electronics. To couple the position detection unit to other components for signaling purposes, the circuit board may comprise plug-in contacts.

In some disclosed embodiments, a communication module, also optionally constructed on the circuit board, provides a driver for a bus system or the like.

The position detection unit may be a multi-touch-sensitive, spatially resolving detection unit that can simultaneously detect a plurality of touch positions in a spatially resolved manner. Through the assignment of the first ends of the relaying element to detection positions on the free-form surface, and an assignment of the second ends to sensor positions on the sensor surface of the position detection unit, it is thus possible through the arrangement and assignment of the relaying elements, to deduce the touch positions on the free-form surface from the determined "touch positions" on the sensor surface.

At least one disclosed embodiment provides that an interpolation of the touch position on the free-form surface is performed on the basis of the "touch position" (transmitted or projected through the relaying elements) determined on the sensor surface. A better spatial resolution is thus possible than that predetermined by the number of the first ends of the relaying elements or the assigned detection positions.

A highly flexible arrangement of the operating surface on the free-form surface is enabled in that the relaying elements are arranged and designed in such a way that a surface density of the detection position on the free-form surface differs in at least one segment from a surface density of the sensor positions on the sensor surface of the position detection unit. Individual regions of the free-form surface can thus have a high resolution, others a lower resolution, but in return cover a larger area.

A device with a spatially resolved touch-sensitive freefrom surface can adopt different characteristics. Such a device can, for example, be formed as a component of a steering system of a transportation vehicle. For example, such a device can be designed as a steering column lever, as a steering wheel rim, as an operating module of a steering wheel spoke, etc.

A further disclosed embodiment provides that a sensor surface of the position detection unit is a touchscreen, and the free-form surface only covers a part of the sensor surface. One region of the touchscreen can thus be used as such. In the region covered, the free-form surface can, however, comprise input regions that can be recognized well through touch, for example, as recessed surfaces or depressions, optionally with rounded banks or walls, such as projections or extended recesses etc. The benefits of a touchscreen are hereby combined with the benefits of an operating surface that can be felt by touch. No further position detection unit is necessary in addition to the touchscreen.

The touch-sensitive free form surface (i.e. the flat touch-sensitive area) can here comprise a larger flat extent than the region covered by the touchscreen.

Optionally, the freeform surface that covers the touchscreen is not transparent. This is relevant when the touch-sensitive freeform surface comprises a surface region that is larger than the covered touchscreen region of the sensor surface, since then in any case a simple, visual assignment of a touch position on the freeform surface to a representation position on the touchscreen is not possible for an observer. The freeform surface can, nevertheless, also have an opaque implementation in other disclosed embodiments.

Figure 1:
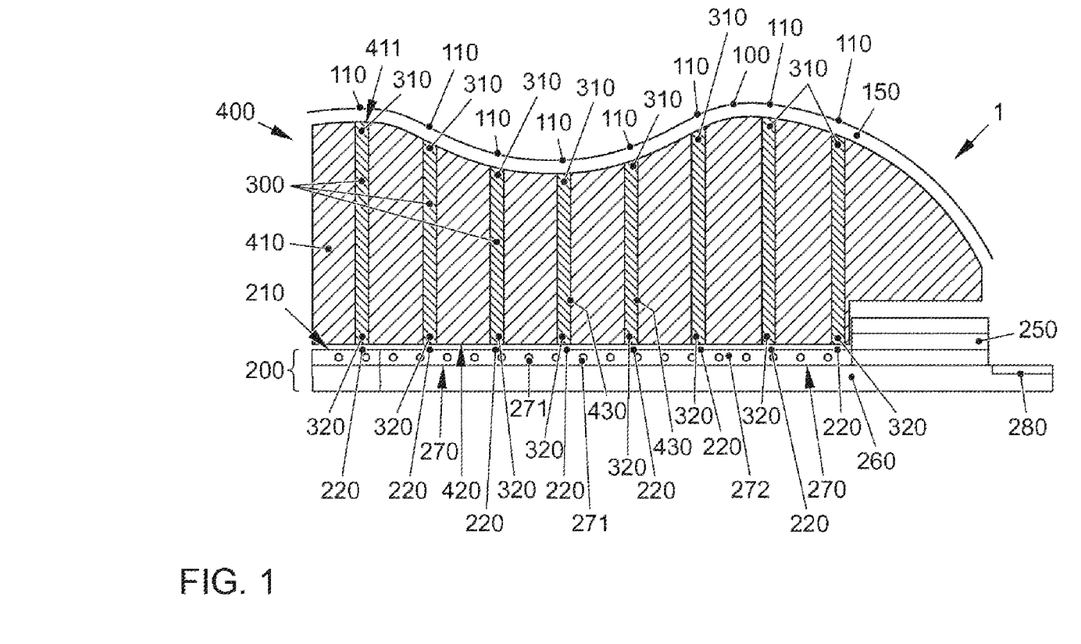
FIG. 1 shows a schematic sectional view of a device with a touch-sensitive free-form surface.

A device 1 with a touch-sensitive outer free-form surface 100 is schematically illustrated schematically in FIG. 1. In this context, touch-sensitive means that touch positions, at least in individual surface regions of the free-form surface 100, can be detected in a spatially resolved manner. In addition to the outer free-form surface 100, the device 1 comprises a position detection unit 200 that is designed to detect touch positions at a sensor surface 210 in a spatially resolved manner. So that touches on the outer free-form surface 100 can be detected in a spatially resolved manner by the position detection unit 200, relaying elements 300 constructed separately from one another are provided between the outer free-form surface 100 and the position detection unit 200. The relaying elements 300 each comprise a first end 310 and an opposing second end 320. The first ends 310 terminate at or in the outer free-form surface 100. The opposing second ends 320 terminate at or on the position detection unit 200 at the sensor surface 210. The first ends 310 are thus assigned to detection positions 110 on the outer free-form surface, while the corresponding second ends 320 are assigned to sensor positions 220 on the sensor surface 210.

It should be pointed out here that the assignment of the second ends to sensor positions usually takes place independently of an internal structure of the position detection unit. A sensor position is merely a position on the sensor surface.

In the illustrated embodiment, the relaying elements 300 are arranged in a physical structure 400 that is constructed as a molded body 410. This may be formed from an insulating material, optionally, plastic, wood or another composite material. A surface 411 follows the outer free-form surface 100 or specifies this outer free-form surface 100 or its contour. In the illustrated embodiment, the device 1 comprises a covering layer 150 formed from an insulating material at the free-form surface 100. This can, for example, consist of a thin layer of leather or a plastic layer or also of a layer of paint.

The relaying elements 300 can be formed as metal rods or pins. The rods or pins are, for example, cast in a plastic material of the molded body 410. In other disclosed embodiments, the channels 430 that are formed in the molded body 410 are filled with a conductive plastic material, for example, a synthetic resin, to which conductive particles, for example, metal chips, in particular, iron chips, silver chips, copper chips, gold chips or carbon particles are added. The individual channels 430 in the molded body 410 are closed off from one another and do not penetrate one another, so that conductive relaying elements 300 that are electrically insulated from one another are formed during the filling. If a touch occurs at the free-form surface 100, a capacitive coupling then takes place through the relaying elements 300 to electrodes 271/272 formed in the detection unit 200 and may be arranged as columns and rows. Evaluation electronics 250 are able to evaluate the capacitive coupling between the intersecting column electrodes 271 and row electrodes 272, and from this to determine a touch position. This is made available as a position signal to connecting contacts 280, for example, as an electronic signal. The connecting contacts 280 are formed on a circuit board 260 on which the electrode pattern 270, for example, intersecting row and column electrodes 271, 272 is formed. The evaluation electronics 250 are also formed on the circuit board 260.

The molded body 410 is planar in form at a sensor contact surface 420, so that the physical structure 400 with the free-form surface 100 can be arranged optimally on the sensor surface 210, which is also planar in form.

Figure 2:
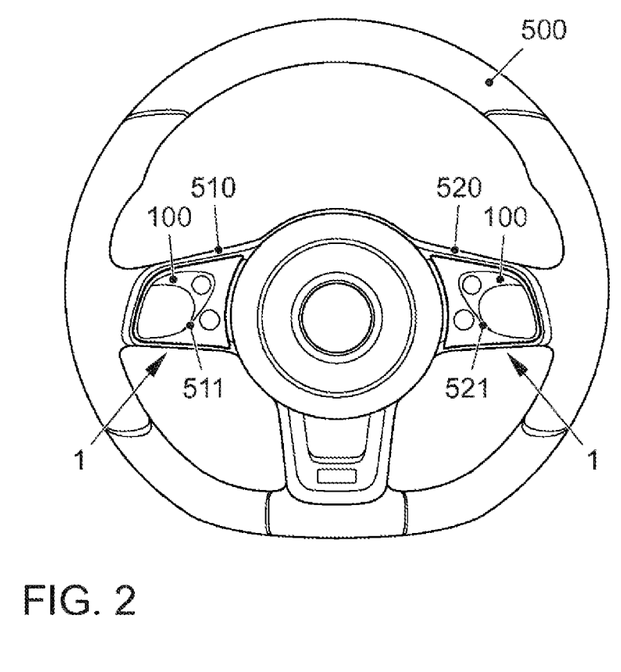
FIG. 2 shows a schematically illustrated steering wheel with two steering wheel detection modules.
Figure 3A:
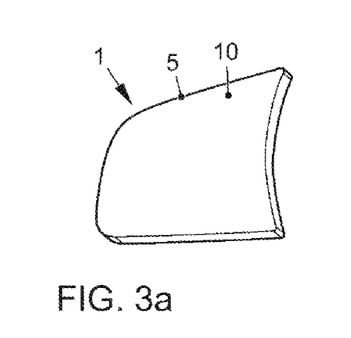
FIGS. 3a-3d show schematic illustrations for the explanation of an embodiment of a device with a touch-sensitive free-form surface.
Figure 3B:
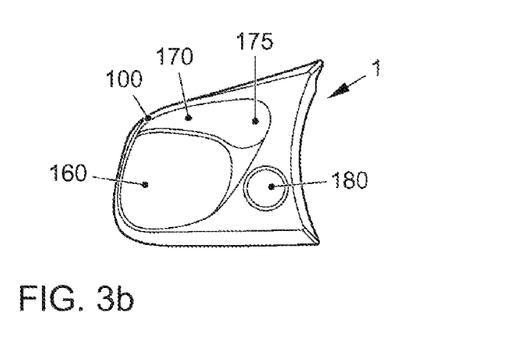
Figures 3C, 3D:
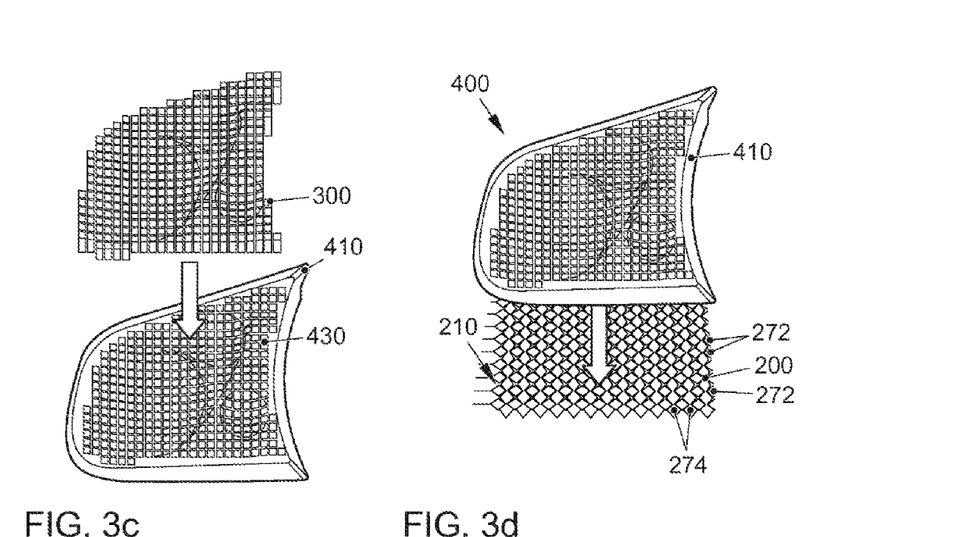

A steering wheel 500 of a transportation vehicle is illustrated schematically in FIG. 2. A left-hand steering wheel operating module 511 is shown in a left-hand steering wheel spoke 510, and a right-hand steering wheel operating module 521 in the right-hand steering wheel spoke 520. The left-hand steering wheel operating module 511 and the right-hand steering wheel operating module 521 respectively represent devices 1 with a touch-sensitive free-form surface 100 in the sense of the embodiments described here. The same technical features are identified in the figures with the same reference signs.

A schematic construction of such a device 1 is intended to be explained schematically with reference to FIGS. 3a-3d. An outer contour 5 of the device 1 is predetermined by the installation space in the spoke 510 of the steering wheel 500 (cf. FIG. 2). An upper outer surface is formed, starting from a surface 10 that curves slightly outward out of the plane of the drawing. Such a surface is shown by way of example in FIG. 3a. In this outer surface 10, which forms the free-form surface 100 of the device 1, an activation surface 160, a somewhat elongated slide controller surface 170 with a terminating depression 175, and a button depression 180 are each formed as recesses.

In a molded body 410 the outer surface of which comprises the described free-form surface 100, and the lower side (not illustrated) of which is planar in form, channels 430 are formed in a regular grid. These channels may be formed as through-holes, although in some disclosed embodiments they can also include a thin material layer as a termination on the lower side, so that these channels form blind holes. Conductive connecting elements 300 are introduced into the channels 430. This can, for example, be done in that the channels are filled with a conductive material, for example, a synthetic resin, to which metal particles or carbon particles are added. Alternatively metal rods matched in their length to the channels can be introduced into the channels 430.

It is, alternatively, possible to first form a blank of a molded body with conductive elements, separate from one another, enclosed, e.g., cast, within it, and to form the outer free-form surface 100 subsequently in a chip-removal method, so that both the connecting elements 300 as well as the regions of the molded body 410 between the relaying elements 300 include the appropriate free-form surface contour. The molded body 410 with the conductive relaying elements 300, which forms a physical structure 400, is subsequently attached to a position detection unit 200 with the flat lower side, so that touches taking place at the outer free-form surface 100 cause capacitance changes at the electrodes 271, 272 of the position detection unit 200 through the relaying elements 300, so that the position detection unit 200 can determine the touch positions projected, so to speak, by the relaying elements 300 into the sensor surface 210 of the position device 240. Touch positions on the sensor surface 210 can be uniquely assigned to touch positions on the free-form surface 100 through the geometry of the relaying elements 300.

Depending on the geometry and design of the relaying elements or of the free-form surface, a spatial resolution on the free-form surface can be higher or lower than a spatial resolution on the sensor surface of the position detection unit.

This is to be explained by way of example with reference to FIGS. 4a-4d. A molded body 410 of a device 1, designed as a steering wheel operating module, with a touch-sensitive free-form surface 100 is schematically illustrated there schematically in FIG. 4a. The individual channels 430 do not extend from a sensor contact surface 420 formed on the lower side perpendicularly upward but rather each extend in a slightly tapering manner outward. This is illustrated schematically for the channels 430 and the relaying elements 300 in FIG. 4b.

Figure 4A:
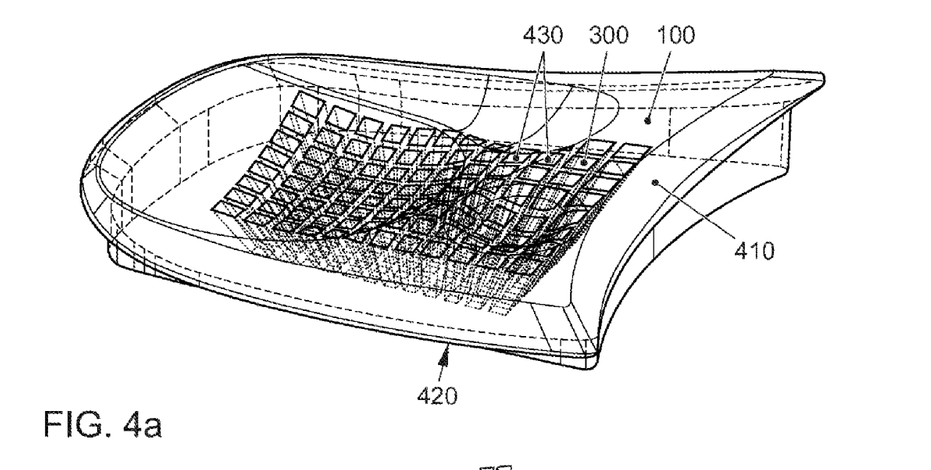
FIGS. 4a-4d show schematic illustrations of an embodiment of a device with a touch-sensitive free-form surface in which the area of the touch-sensitive region on the free-form surface is larger than a sensor surface of the position detection unit.
Figure 4B:
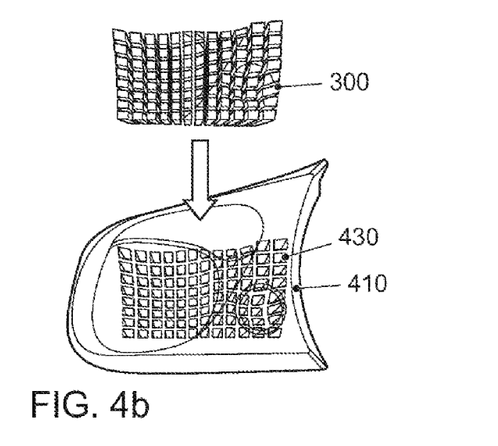
Figure 4C:
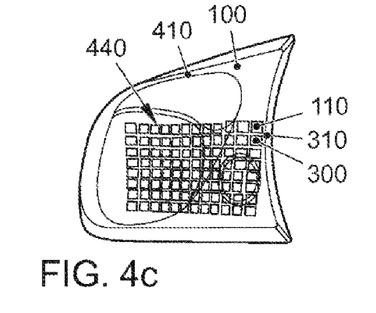
Figure 4D:
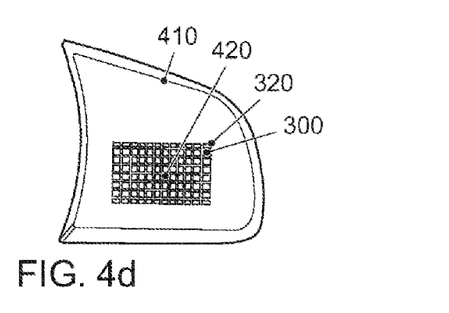

The plan view of the free-form surface 100 is illustrated in FIG. 4c. The cross-sectional surfaces of the first ends 310 of the relaying elements 300 can be seen clearly. A total touch-sensitive surface 440 over which the detection positions 110 are distributed, which are linked to the first ends 310 of the relaying elements 300 or to which these first ends 310 are assigned, is larger than a sensor contact surface 420. The plane lower side of the molded body 410, with the second ends 320 of the relaying elements 300 formed therein, which indicate the size of the sensor contact surface 420, is shown in FIG. 4d. It can be seen clearly that a surface taken up by the second ends 320 is significantly smaller. It follows from this that a spatial resolution on the free-form surface 100 will be lower than a spatial resolution on the sensor surface of the position detection unit on which the sensor contact surface 420 formed by the second ends 320 of the relaying elements 300 is placed.

In the disclosed embodiments illustrated in FIGS. 3a to 3d and FIGS. 4a to 4d, the relaying elements each protrude flush into the free-form surface of the device. It is, however, as a rule ideal for an outer surface, which is attractive from visual and tactile points of view, to be formed on the free-form surface or to constitute it. Thin layers formed of leather, wood, plastic or also as a layer of paint, are suitable for this purpose.

Figure 5:
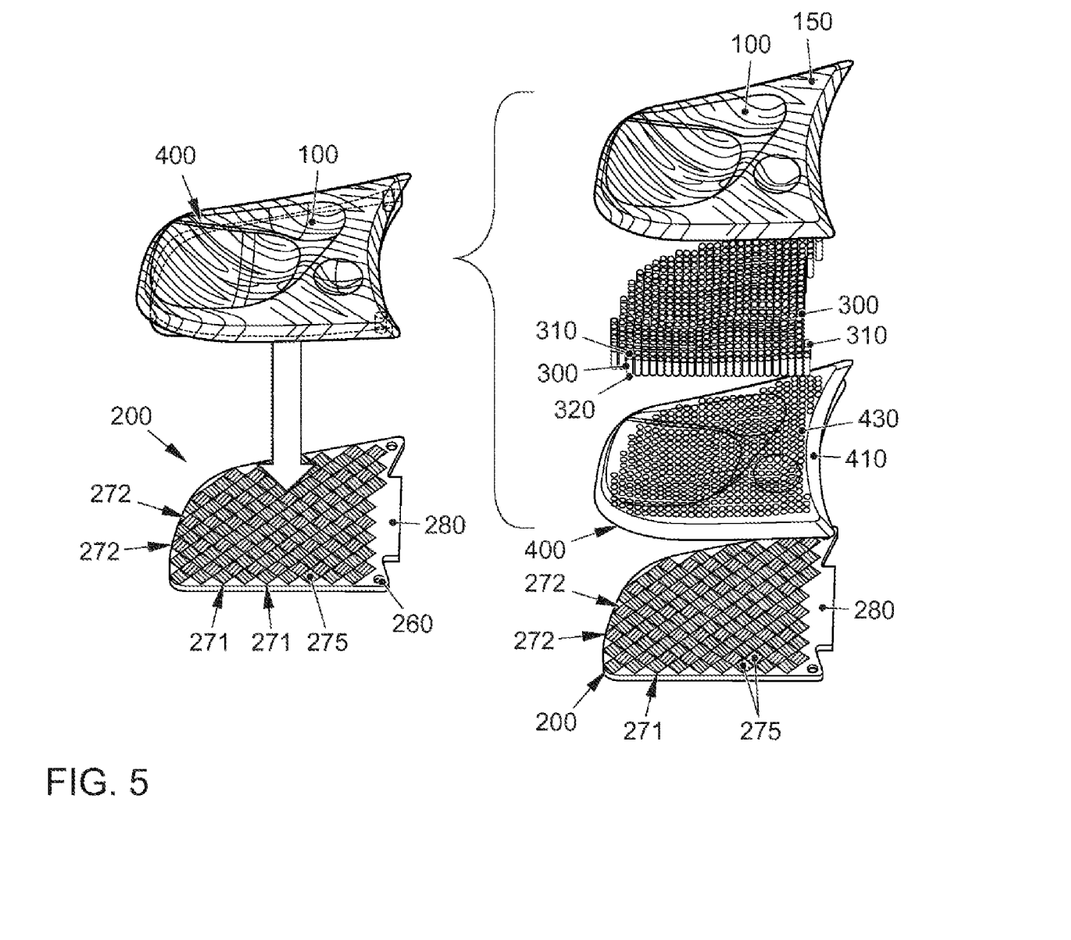
FIG. 5 shows schematic illustrations for the explanation of an embodiment of a device with a touch-sensitive free-form surface.

The modular structure of the physical structure 400, which comprises a free-form surface 100 and relaying elements 300 that terminate at a planar lower side with their second ends 320, and a position detection unit 200 which may be constructed on a circuit board 260, is shown schematically in FIG. 5. The position detection unit usually comprises diamond-shaped electrode elements 275 which may be connected together to form rows 272 and columns 271 running perpendicular to them. The evaluation electronics (not illustrated) which can determine the touch position "projected" through the relaying elements 300 onto the position detection unit 200 and make it available as an electronic signal are furthermore arranged on the circuit board. Optionally, the electronics are fitted with a communication module (not illustrated) which can exchange, for example, standardized signals over a transportation vehicle bus system, for example, a CAN bus, a FlexRay bus, LIN bus or the like. Connecting contacts 280 are formed on the circuit board 260 for the electrical power supply and for the connection of signals.

On the right-hand side, an exploded drawing of the physical structure 400 is shown, which comprises the outer protective layer 150, the electrically conductive relaying elements 300 which are formed separately from one another, as well as a molded body 410 for holding the relaying elements 300 and determining the contour of the outer free-form surface 100. This physical structure 400 is arranged on the position detection unit 200, and may be firmly bonded to it, for example, being screwed, glued or the like.

Figure 6:
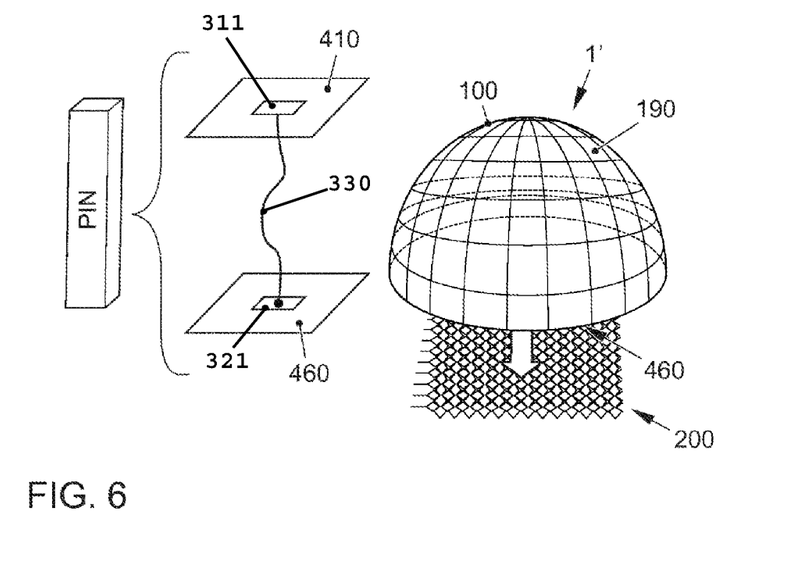
FIG. 6 shows a schematic illustration of a device in which the free-form surface has a spherical surface.

A further schematic illustration of a device 1 with an outer free-form surface 100, such as a hemisphere, is illustrated in FIG. 6. Individual conductive touch segments 311 which may be formed on an inner side of a molded body 410 are assigned to individual spherical surface elements 190. These are, for example, connected by an insulated wire 330, each having a further contact surface, to a sensor segment 321, and form a relaying element 300. The sensor segments 321 here may be mounted in a further planar molded body 460. A position detection unit 200, as described above, is again arranged underneath the further molded body 460.

Figure 7:
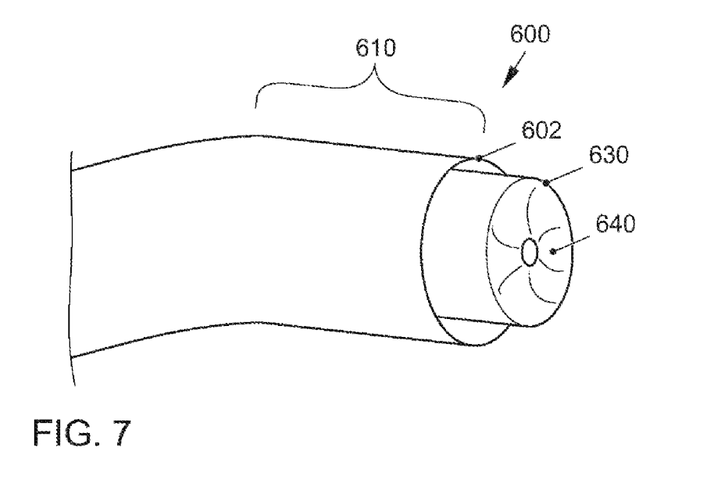
FIG. 7 shows a schematic view of one end of a steering column lever.

Other, complicated free-form surfaces, however, which may in part be mounted such that they can move with respect to one another, can also be connected by a common position detection unit, and combined to form a common device with a touch-sensitive free-form surface. Such a device can, for example, be designed as a steering column lever 600, as is illustrated in FIG. 7. This steering column lever 600 comprises an end segment 610 of cylindrical design on the outer surface of which touch positions can be detected in a spatially resolved manner. An end cap 630 which is formed with an inwardly-curved touch-sensitive depression is, in addition, arranged at one end 602 of the steering column lever.

Figure 8:
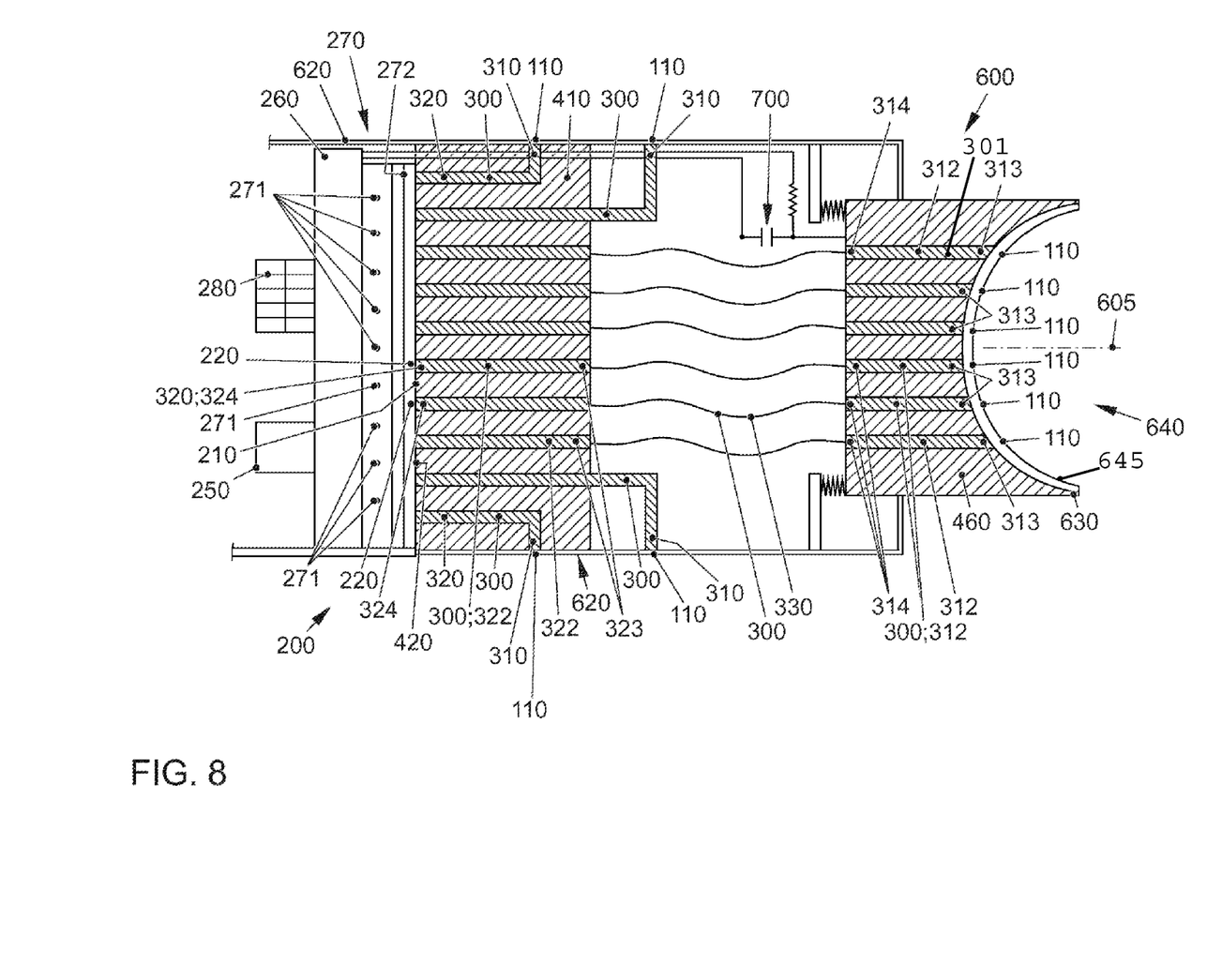
FIG. 8 shows a sectional view through the steering column lever according to FIG. 7.

A schematic sectional view of such a steering column lever is illustrated in FIG. 8. Relaying elements 300, whose first ends 310 terminate at detection positions 110 of a casing surface 620, are held in a first molded body 410 in the interior of the steering column lever 600. Second ends 320 of the relaying elements 300 terminate at a sensor contact surface 420 of the first molded body 410. First end segments 312 of further relaying elements 301 are mounted in a further molded body 460. These first end segments 312 each terminate at a recessed surface 645 of the depression 640 of the end cap 630. The end cap 630 is mounted in a spring-loaded manner against the rest of the steering column lever 600, and can, when pressed, deflect end cap 630 into the steering column lever and close a tap switch (not illustrated).

Second end segments 322 of the relaying elements 301 are, furthermore, mounted in the first molded body 410, the second ends 324 of which terminate at the sensor contact surface 420. First ends 323 of the second end segments 322 are electrically conductively connected via insulated wire or cable segments 330 to second ends 314 of the first end segments. The first ends 313 of the first end segments 312 are assigned to detection positions 110 of the recessed surface 645. The relaying elements 301 that consist of the first end segments 312, the cable segments 330 and the second end segments 322, are thus coupled to the position detection unit. The position detection unit 200 with its sensor surface 210 is arranged in such a way that a normal to the surface of the sensor surface 210 is oriented parallel to a cylindrical axis 605 of the cylindrical casing surface 620. The position detection unit 200 is again formed on a circuit board 260 on which the evaluation electronics 250 are formed as well as any bus drivers that might be necessary, to be able to establish a connection to a transportation vehicle bus and/or a control device through connecting contacts 280.

Figure 9:
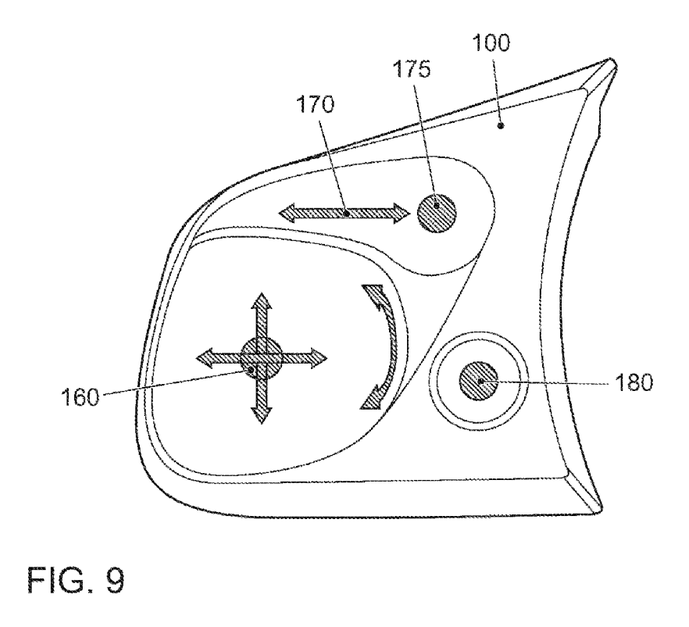
FIG. 9 shows a schematic plan view of a steering wheel operating module designed with a free-form surface.

The various input facilities with the steering wheel operating module described in FIG. 2 to FIG. 5 are intended to be explained with reference to FIG. 9. Both horizontal and vertical swiping movements as well as rotating movements on the action surface 160 can be detected easily and reliably. Single and multiple tapping gestures can, in addition, be detected. The position detection unit may be designed as a multi-touch device, so that it can detect a plurality of touch positions simultaneously. Operating gestures on the action surface that can easily be executed with two fingers, such as spreading apart and pushing together, the parallel movement of a plurality of fingers etc., can thus also be detected as touch gestures. Sliding movements along the elongated recessed direction may be detected in the elongated slide controller surface 170. The terminating depression 175 may be designed for a single or double-tap gesture detection. The button depression 180, finally, may be designed for single, double or triple-tap gesture detection.

Touching of fingers taking place on the casing surface 620 in the end segment 610 can be detected in a spatially resolved manner at the steering column lever 600 described in FIGS. 7 and 8. Rotary movements executed with the fingers on the casing surface around the cylindrical axis 605 as well as axially executed slide movements parallel to the cylindrical axis 605 can, furthermore be detected. Single or multiple tapping movements in the recessed surface 645 can be detected independently and in addition to a possible, additional, actuation of the spring-loaded tap switch, wherein the tap switch can be actuated by pressing the end cap 630 in against the spring loading. In other disclosed embodiments the end cap 630 can also be formed as one piece with the casing surface 620, so that the single or multiple tap-touch that is detected in the recessed surface 645 can replace a triggering of the tap switch.

To improve a coupling of the relaying elements to the position detection unit, it is provided in some disclosed embodiments that the relaying elements have an electrically conductive coupling to electrode surfaces of the position detection unit. In such a disclosed embodiment an arrangement and design of the second ends at the contact surface is to be adapted to the electrode pattern of the position detection unit, which otherwise is not necessary.

Altogether, the possibility is created by the disclosure of forming very flexible free-form surfaces and integrating them, for example, into cockpits of transportation vehicles or other transportation vehicles. It is also possible to form touch-sensitive regions in an instrument panel, for example, at different locations or distributed over the whole instrument panel, in that first contact surfaces are arranged therein in the free-form surface or adjacent to the free-form surface, and are connected via conductive connecting segments to second contact surfaces that are arranged adjacent to a spatially-resolving position detection sensor. A great freedom and flexibility for the design of operating surfaces in a transportation-vehicle cockpit is thereby created.

Because a physical structure specifies the free-form surface and comprises the relaying elements, the free-form surface can usually be separated easily from a position detection unit. The possibility of alternatively coupling the position detection unit to various free-form surfaces is created. The cockpit design is thereby made more flexible. The physical structures that are provided with the free-form surface in which the relaying elements are formed can be easily manufactured in large numbers economically in an injection molding method. Also alternatively produced embodiments in which free-form surfaces are created through a chip-removal method from blanks with conductive channels or rods arranged in their interior can be coupled to a standardized position detection unit, so that individualized single fabrications, for example, individually modified free-form surfaces, can also be employed in cockpit environments.

It goes without saying that the embodiments described above are only exemplary embodiment, and the disclosure can be applied to a large number of further free-form surfaces.

LIST OF REFERENCE SIGNS

1 Device with touch-sensitive free-form surface
5 Outer contour
10 Surface
100 Free-form surface
110 Detection position
150 Covering layer
160 Activation surface
170 Slide controller surface
175 Terminating depression
180 Button depression
190 Spherical surface element
200 Position detection unit
210 Sensor surface
220 Sensor positions
250 Evaluation electronics
260 Circuit board
270 Electrode pattern
271 Column detectors
272 Row detectors
275 Electrode elements
280 Connecting contacts
300 Relaying elements
301 Relaying elements
310 First ends
311 Touch segment
312 First end segments
313 First ends
314 Second ends
320 Second ends
321 Sensor segment
322 Second end segments
323 First ends
324 Second ends
330 Cable segments
400 Physical structure
410 (First) molded body
411 Surface
420 Sensor contact surface
430 Channels
440 Total touch-sensitive surface
460 Further molded body
500 Steering wheel
510 Left-hand spoke
511 Left-hand steering wheel detection module
520 Right-hand spoke
521 Right-hand steering wheel detection module
600 Steering column lever
602 End
605 Cylindrical axis
610 End segment
620 Casing surface
630 End cap
640 Depression
645 Recessed surface

The invention claimed is:

1. A device with a free-form touch-sensitive surface, the device comprising:
   an insulating body having a free-form surface, the free-form surface having recesses and/or projections creating a three-dimensional, arbitrary shape;
   the free-form touch-sensitive surface disposed on the insulating body free-form surface creating a device outer surface;
   a position detection unit with a sensor surface, and
   a plurality of conductive relaying elements integrated within the insulating body between the sensor surface and the insulating body free-form surface, each of the plurality of conductive relaying elements having a first end and an opposing second end,
   wherein the sensor surface and the free-form insulating body surface have different geometrical shapes, and
   wherein the first ends are assigned to different detection positions on the free-form touch-sensitive surface, and the second ends are assigned to different sensor positions on the sensor surface of the position detection unit, so that touches on the free-form touch-sensitive surface are transmitted via the conductive relaying elements to the sensor surface and are detected spatially by the position detection unit.

2. The device of claim 1, wherein the sensor surface is of planar design.

3. The device of claim 1, wherein the free-form touch-sensitive surface has a three-dimensional form.

4. The device of claim 1, wherein the sensor surface of the position detection unit is a touchscreen, and the free-form touch-sensitive surface only covers a part of the sensor surface.

5. The device of claim 1, wherein the conductive relaying elements are arranged in a regular grid.

6. The device of claim 1, wherein the insulating body free-form surface comprises openings into which the relaying elements are inserted.

7. The device of claim 1, further comprising a protective layer formed from an insulating material disposed on the device outer surface.

8. The device of claim 1, wherein the insulating body is an insulated molded body and the conductive relaying elements are formed at least in segments as conductive channels in the molded body whose at least one surface follows or specifies a contour of the free-form surface.

9. A method for the manufacture of a device with a free-form touch-sensitive, the method comprising:
   providing or forming a position detection unit with a sensor surface;
   forming an insulating body with a free-form surface, the free-form surface having recesses and/or projections creating a three-dimensional, arbitrary shape; and
   integrating a plurality of mutually separate conductive relaying elements into the insulating body, each of which comprises a first end and an opposing second end, wherein the first ends are assigned to different detection positions on the free-form insulating body surface and the second ends terminate at different positions of a sensor contact surface and the insulating body and the position detection unit are arranged with respect to one another so the sensor surface and the sensor contact surface are adjacent to one another, so that touches to the free-form touch-sensitive surface are transmitted via the conductive relaying elements to the sensor surface and are detected spatially by the position detection unit.

10. The method of claim 9 wherein the formation of the insulating body comprises:
    forming a molded body; and
    forming mutually separate channels in the molded body; and
    introducing conductive relaying elements into the channels.

11. The method of claim 9 comprising casting or injecting the conductive relaying elements into the channels.

12. The method of claim 9 comprising manufacturing the insulating body by an injection molding or injection stamping method.

13. The method of claim 9 comprising forming the conductive relaying elements out of a conductive plastic.

* * * * *